United States Patent [19]

Seki

[11] Patent Number: 4,964,937

[45] Date of Patent: Oct. 23, 1990

[54] THIN FILM ADHERING METHOD AND THIN FILM ADHERING APPARATUS

[75] Inventor: Mitsuhiro Seki, Tokyo, Japan

[73] Assignee: Somar Corporation, Tokyo, Japan

[21] Appl. No.: 410,787

[22] Filed: Sep. 22, 1989

[30] Foreign Application Priority Data

Sep. 22, 1988 [JP] Japan ................................ 63-237869

[51] Int. Cl.⁵ ............................................ B32B 31/18
[52] U.S. Cl. .................................... 156/250; 156/256; 156/497; 156/521; 156/522; 156/552
[58] Field of Search ............... 156/497, 521, 522, 552, 156/555, 250, 256

[56] References Cited

U.S. PATENT DOCUMENTS

| | | | |
|---|---|---|---|
| 4,354,894 | 10/1982 | Lewis et al. | 156/521 |
| 4,585,509 | 4/1986 | Obayashi | 156/522 |
| 4,659,419 | 4/1987 | Miyaka | 156/522 |
| 4,717,441 | 1/1988 | Seki et al. | 156/522 |
| 4,790,895 | 12/1988 | Matsuo | 156/521 |
| 4,844,772 | 7/1989 | Sumi et al. | 156/552 |
| 4,888,083 | 12/1989 | Sumi et al. | 156/521 |

*Primary Examiner*—Calebq Weston

*Attorney, Agent, or Firm*—Sughrue, Mion, Zinn, Macpeak & Seas

[57] ABSTRACT

A thin film adhering apparatus and method in which a thin film whose length corresponds to that of a substrate is adhered to the substrate by applying pressure using a pressure adhering roller. The apparatus includes a substrate conveyance mechanism for conveying the substrate to a thin film adhering position and conveying the substrate from that position; a thin film feeding member for suctioning the leading edge portion of the continuous thin film and supplying the leading edge portion to the adhering position; a leading edge portion holding member having a holding side which comes into surface contact with the leading edge portion of the thin film, the holding side having suction holes communicating with a vacuum suction system for suctioning the leading edge portion of the film, the continuous thin film held in the thin film adhering position by the holding member being adhered to the thin film adhering side of the substrate to the trailing edge portion thereof by the pressure adhering roller; and a cutter for cutting the continuous thin film at the trailing edge portion thereof to the length corresponding to that of the base.

9 Claims, 5 Drawing Sheets

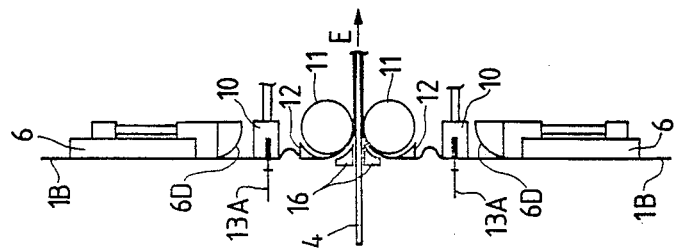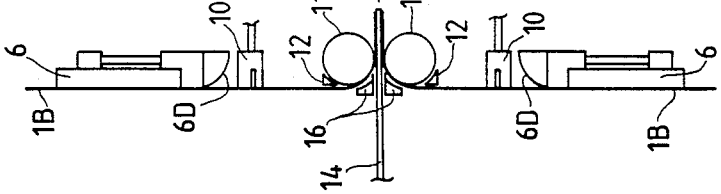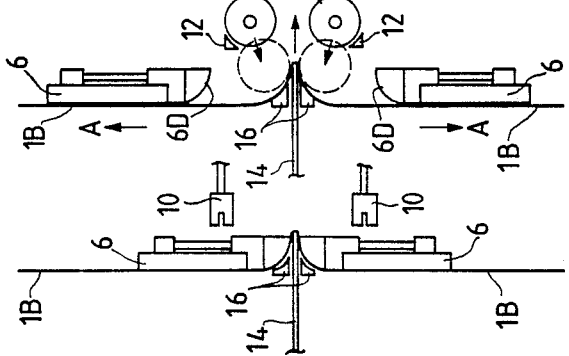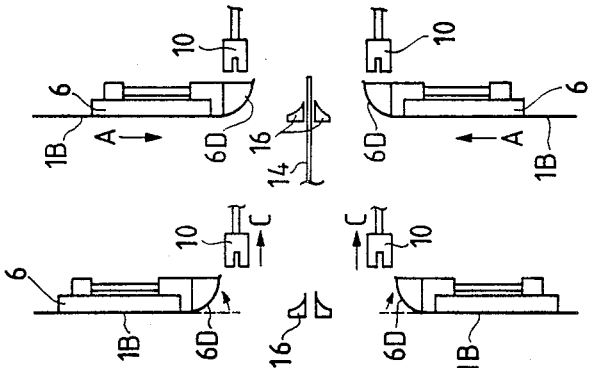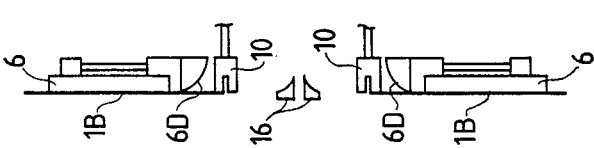

THIN FILM ADHERING METHOD AND THIN FILM ADHERING APPARATUS

BACKGROUND OF THE INVENTION

1. Field of the Invention

The present invention relates to an art of adhering a thin film and particularly relates to a more effective art in which a thin film whose length corresponds to that of a base plate, is adhered to the thin film adhering side of the plate.

2. Background

In a conventional process of manufacturing a printed circuit board for an electronic appliance such as a computer a laminated film is adhered to the surface of a base plate for a printed circuit. The laminated film consists of a photosensitive resin layer and a light-transmissive resin film. The photosensitive resin layer is adhered directly to the surface of the base plate. The light-transmissible resin film is provided on the photosensitive resin layer to protect it. The laminated film is adhered to the base plate by a thin film adhering apparatus as described in the Japanese Patent Application (OPI) No. 11787/88 (the term "OPI" as used herein means an "unexamined published application") made by the present Applicant.

The procedure of adhering the laminated film to the base plate is as follows. The leading edge portion of the base plate is first conveyed to a thin film adhering position by a base plate conveyance mechanism and stopped in that position. The leading edge portion of the continuous laminated film supplied from a thin film feed roller is then suctioned against a main vacuum suction plate which is a thin film feed member. A thin film temporary adhering member is provided at the leading end of the main vacuum suction plate facing the thin film adhering position so that the leading edge portion of the laminated film is suctioned onto the temporary adhering member. The temporary adhering member has suction holes communicating with a vacuum suction system for suctioning the laminated film. A heater for temporarily adhering the leading edge portion of the laminated film is provided in the temporary adhering member.

The main vacuum suction plate and the thin film temporary adhering member are moved to the vicinity of the thin film adhering position or the surface of the leading edge portion of the base plate. The leading edge portion of the laminated film is then brought into contact with the surface of the leading edge portion of the base plate, and temporarily adhered thereto under heat and pressure by the temporary adhering member. Thereafter the main vacuum suction plate and the thin film temporary adhering member no longer apply suction and are moved away from the thin film adhering position. At that time, the leading edge portion of the laminated film does not deviate from the thin film adhering position because the leading edge portion is already temporarily adhered to the surface of the base plate. A heat and pressure adhering roller is thereafter moved to the thin film adhering position so that the temporarily adhered portion of the laminated film is pressed by the roller. The roller is then rotated as the laminated film remains pressed by the roller so that the whole laminated film is gradually adhered to the surface of the base plate, under heat and pressure, while the base plate is being conveyed.

The laminated film is automatically supplied to the thin film adhering position by the rotation of the heat and pressure adhering roller and the conveyance of the base plate. During the heat and pressure adhering of the laminated film of the surface of a base plate the trailing edge of the base plate is detected to generate a detection signal, in accordance with which the continuous laminated film is cut at the trailing edge portion thereof. For that reason, the length of the cut-off laminated film corresponds to that of the base plate extending in the direction of the conveyance thereof. Cutting the laminated film is performed by moving a disk-shaped cutting member across the direction of the supply of the laminated film as the film is held at the trailing edge portion thereof by the suction of an auxiliary vacuum suction plate provided at the feed passage for the laminated film. The trailing edge portion of the laminated film cut as mentioned above is held by the suction of a thin film trailing edge portion suction member so that an appropriate tensile force is applied to the laminated film. Simultaneously, the trailing edge portion of the laminated film is guided to the trailing edge portion of the base plate so that the trailing edge portion of the film is adhered to the surface of the trailing edge portion of the base plate under heat and pressure, by the heat and pressure adhering roller. The base plate with the laminated film adhered thereto by the thin film adhering apparatus as described above is conveyed to an exposure apparatus installed next thereto. Such a thin film adhering art, in which a portion of a laminated film is temporarily adhered to a base plate for a printed circuit and the laminated film is thereafter completely adhered to the base plate, under heat and pressure, was disclosed in the West German Patent DE No. 3334009 C2 and the Japanese Patent Application No. 49169/87.

The above-mentioned conventional procedure of adhering the laminated film to the base plate includes the step of temporarily adhering the leading edge portion of the laminated film to the base plate. For the temporary adhering complicated conditions such as temporary adhering temperature, temporary adhering period and temporary adhering pressure need to be set. This is a problem. For example, some laminated bodies cannot necessarily be securely adhered to the base plate. For such reasons, the temporary adhering conditions are complicated. The conditions are likely to vary due to the number of times of temporary adherence, the change in the environment and so forth. This is another problem. If the photosensitive resin layer of the laminated film is nonuniformly adhered to the base plate or the base plate is so thin as to be likely to be affected by the heat, a void is caused as a defect between the temporarily adhered portions of the film and the plate such that the film may not remain adhered to the plate. This is yet another problem. The leading edge portion of the laminated film cannot be temporarily adhered to the surface of the base plate, under heat and pressure, by the thin film temporary adhering member instantaneously but needs to be maintained under heat and pressure by the temporary adhering member for a prescribed length of time. For that reason, the period of adhering of the laminated film to the base plate is increased due to the temporary adhering. This is yet another problem. Since the thin film adhering member includes not only a mechanism for suctioning the leading edge portion of the laminated film but also the heater, the construction of the thin film adhering apparatus is more complicated due to that of the temporary adhering member. This is yet another problem.

SUMMARY OF THE INVENTION

The present invention was made in order to solve the above-mentioned problems.

Accordingly, it is an object of the present invention to provide a thin film adhering apparatus in which a thin film whose length corresponds to that of a base plate is adhered to the thin film adhering side of the plate by a pressure adhering roller. The thin film adhering apparatus comprises a base plate conveyance mechanism for conveying the base plate to a thin film adhering position and conveying the plate from that position: a thin film feed member for suctioning the leading edge portion of the continuous thin film and supplying the leading edge portion to the thin film adhering position: a thin film leading edge portion holding member having a holding side which comes into surface contact with the leading edge portion of the thin film supplied to the thin film adhering position the holding side having thin film suction holes communicating with a vacuum suction system for suctioning the leading edge portion of the thin film onto the holding side, the continuous thin film held in the thin film adhering position by the holding member being adhered to the thin film adhering side of the base plate from the leading edge portions of the film and the plate to the trailing edge portion thereof by the pressure adhering roller; and a cutter for cutting the continuous thin film at the trailing edge portion thereof to the length corresponding to that of the base plate. Since the thin film leading edge portion holding member is simple in construction and has the holding side and the thin film suction holes provided therein, the holding member is included in the thin film adhering apparatus instead of a temporary adhering member which is complicated in construction and which has a heater built therein. Therefore, the construction of the apparatus is simplified.

It is another object of the present invention to provide a method in which a thin film, whose length corresponds to that of a base plate, is adhered to the thin film adhering side of the plate by a pressure adhering roller. The method is characterized by the following steps: suctioning the leading edge portion of the continuous thin film onto a thin film feed member; moving the thin film feed member to the vicinity of the thin film adhering side of the leading edge portion of the base plate conveyed to a thin film adhering position, so that the leading edge portion of the continuous thin film is supplied to that position; moving the feed member away from the thin film adhering side of the base plate; moving the pressure adhering roller to the vicinity of the leading edge portion of the thin film held in the thin film adhering position and thereafter rotating said roller so that the film is adhered to the thin film adhering side of the base plate from the leading edge portion thereof to the trailing edge portion thereof while the film is being automatically supplied to the thin film adhering position; and cutting the continuous thin film at the trailing edge portion thereof to the length corresponding to that of the base plate, and thereafter adhering the trailing edge portion of the film to the thin film adhering side of the trailing edge portion of the base plate by the pressure adhering roller. Since the leading edge portion of the thin film is supplied to the thin film adhering position and thereafter held in that position at the time of conveying the pressure adhering roller into that position the leading edge portion of the film does not need to be temporarily adhered to the thin film adhering side of the base plate at the leading edge portion thereof. For that reason, complicated conditions such as temporary adhering temperature, temporary adhering period and temporary adhering pressure do not need to be set. Therefore, improper temporary adhering such as nonuniform temporary adhering and void-production temporary adhering, which would result from failing to properly set the complicated conditions is avoided. As a result, the yield in the adhering of the thin film to the baseplate is improved. Since the leading edge portion of the thin film does not need to be temporarily adhered to the base plate, the thin film feed member can be moved from the thin film adhering position immediately after the supply of the leading edge portion of the thin film to the position so as to allow the conveyance of the pressure adhering roller into position. For that reason, the period of the adhering of the thin film to the base plate can be shortened.

Other objects and novel features of the present invention will be apparent from the description herein and the drawings attached hereto.

DESCRIPTION OF THE DRAWINGS

FIGS. 5, 6, 7, 8 9, 10 and 11 show schematic view of major parts of the thin film adhering apparatus in the steps of thin film adhering.

DETAILED DESCRIPTION OF THE INVENTION

Figure 1:
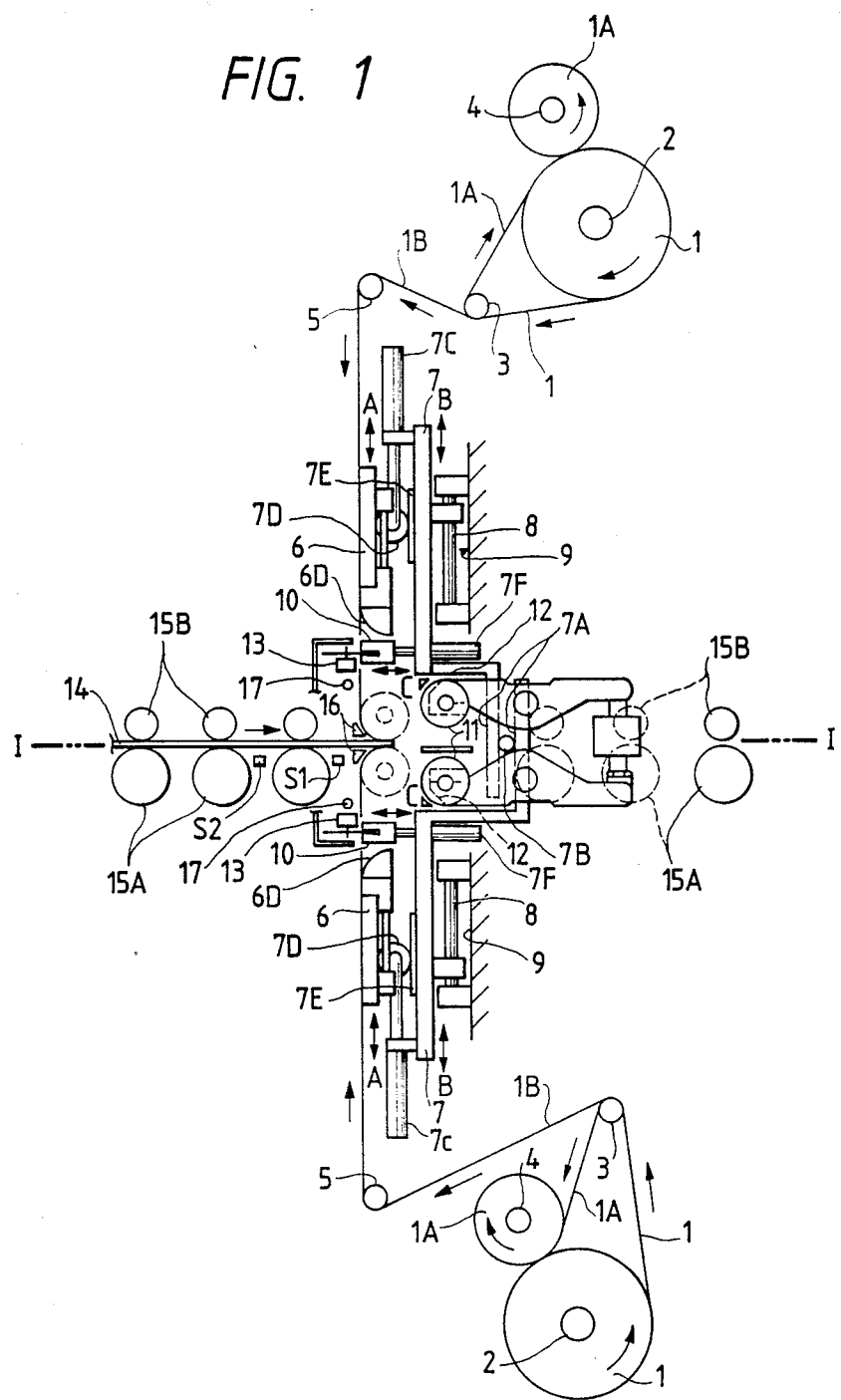
FIG. 1 shows a schematic view of a thin film adhering apparatus which is an embodiment of the present invention.

Embodiments of the present invention are hereafter described in detail with reference to the drawings attached hereto. The mutually equivalent portions shown in the drawings are denoted by the same reference symbols therein.

Figure 12:
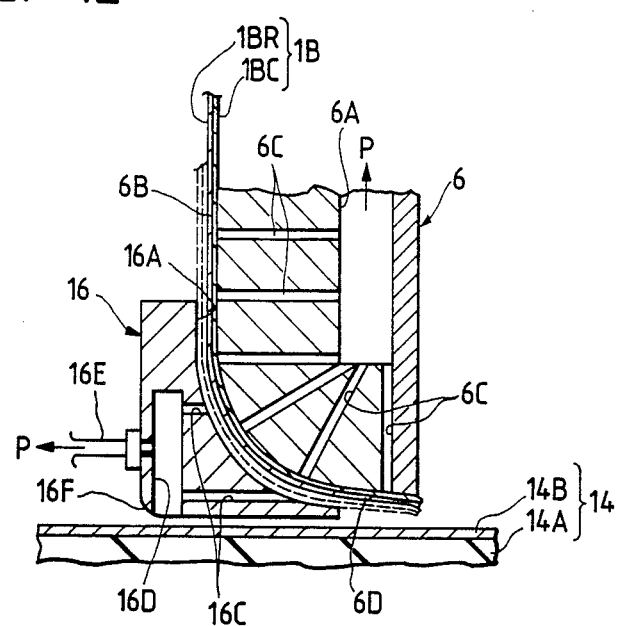
FIGS. 12 and 13 show enlarged sectional views of major parts of the thin film adhering apparatus.
Figure 13:
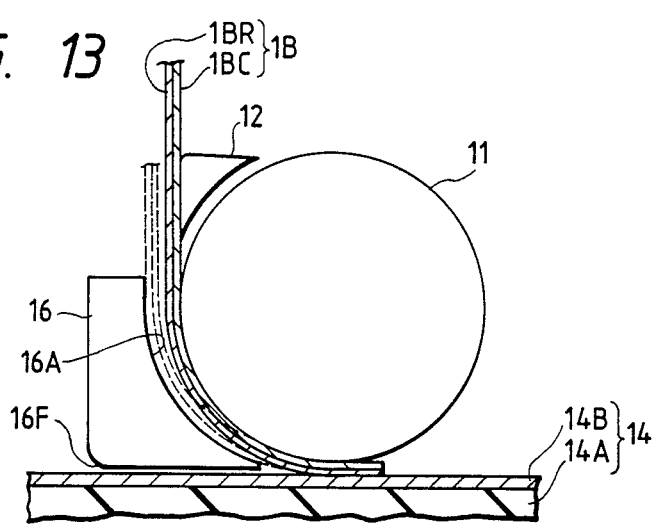

FIG. 1 shows a thin film adhering apparatus which is one of the embodiments and in which a laminated film 1B. which is a part of a laminated body 1 consisting of a light-transmissible resin film, a photosensitive resin layer and another light-transmissible resin film, is adhered to a base plate for a printed circuit, using heat and pressure. The laminated body 1 is continuously wound on a feed roller 2 in advance. The laminated body 1 is supplied from the feed roller 2 so that a thin film separation roller 3 divides the laminated body into the laminated film 1B comprising the light-transmissible resin film 1BC and the photosensitive resin layer 1BR exposed on the side which is to be adhered as shown in FIGS. 12 and 13. The light-transmissible resin film 1A is wound on a winding roller 4. A pair of feed rollers 2 and a pair of winding rollers 4 are provided above and below a base plate conveyance passage I—I. The leading edge portion of the laminated film IB is supplied to a main vacuum suction plate 6, which acts as a thin film feed member, along a tension roller 5 which applies an appropriate tensile force to the laminated film between the feed roller 2 and the main vacuum suction plate to prevent the laminated film from becoming wrinkled or the like.

The main vacuum suction plate 6 is moved toward and away from a thin film adhering position in the directions A. as shown in FIG. 1. The plate 6 is disposed on the feed passage of the laminated film 1B so as to convey the laminated film from the feed roller 2 to the thin film adhering position. The plate 6 is supported on a support member 7, which is moved toward and away from the thin film adhering position in directions B as shown in FIG. 1. The support member 7 is slidably disposed on a guide member B of the frame 9 of the thin film adhering apparatus so that the support member is slidable on the guide member in the directions B. A pair of main vacuum suction plates 6 and a pair of support members 7 are provided above and below the base plate conveyance passage I—I. The upper and the lower support members 7 are coupled to each other by a rack and pinion mechanism so that. The support members are moved in conjunction with each other. That is, the support members 7 are moved toward and away from each other through the action of racks 7A and a pinion 7B engaged therewith. A driver (not shown) is coupled to one of the upper and the lower support members 7 for moving in the above-mentioned directions. The driver may include an air cylinder, a hydraulic cylinder, an electromagnetic cylinder, a step motor and a transmission mechanism which transmits the action of the step motor or the like.

The main vacuum suction plate 6 can be moved in the directions A together with the support member 7 or separately therefrom. The movement of the plate 6 separately from the support member 7 is performed by a driver 7C provided on the support member 7 and a rack and pinion mechanism coupled to the driver. The rack and pinion mechanism includes a pinion 7D coupled to the shaft of the driver 7C. a rack 7E provided on the support member 7 and a rack provided on the reverse side of the main vacuum plate 6 which does not apply suction to the laminated film 1B (not shown). The driver 7C may include an air cylinder, a hydraulic cylinder an electromagnetic cylinder, a step motor and a transmission mechanism which transmits the action of the step motor or the like. As illustrated in FIG. 12, the main vacuum suction plate 6 has a plurality of thin film suction holes 6C extending from an internal vacuum suction chamber 6A to a thin film suction side 6B. The suction holes 6C are provided at regular intervals in the suction side 6B. The vacuum suction chamber 6A communicates with a vacuum suction system P such as a vacuum pump (not shown). The suction system P acts through the vacuum suction chamber 6A and the suction holes 6C of the main vacuum suction plate 6 so that the obverse side of the light-transmissible resin film 1BC of the laminated film 1B consisting of the film and the photosensitive resin layer 1BR is suctioned onto the thin film suction side 6B of the main vacuum suction plate.

The single vacuum suction chamber 6A of the plate 6 is provided in common for all the suction holes 6C. The suction plate 6 may be provided with a plurality of vacuum suction chambers 6A along the width of the laminated film 1B so that each of the chambers corresponds to a prescribed number of the thin film suction holes 6C and is independent of the other vacuum suction chambers in regard to applying suction. If the plurality of vacuum suction chambers are provided in the suction plate 6 to perform the vacuum suction action independently of each other, the suctioning force of the plate, which suctions the laminated film 1B onto the thin film suction side 6B. is maintained even if the width of the laminated film changes.

The thin film suction side 6B of the plate 6 is provided with thin grooves around the suction holes 6C similarly to those described in detail in the Japanese Patent Applications (OPI) Nos. 259834/87 and 117487/88 disclosed by the present Applicant. The thin film suction side 6B of the plate 6 is curved in an arcuate manner at the leading end portion 6D thereof as shown is FIGS. 1 and 12. The arc-shape of the suction side 6B corresponds to the shape of the laminated film contact surfaces of a heat and pressure adhering roller 11 and a thin film leading edge portion holding member 16. A plurality of thin film suction holes 6C are also provided in the leading end portion 6D of the plate 6 to hold the leading edge portion of the laminated film 1B on the arc-shaped surface of the plate at the leading end portion thereof by suctioning against the resilience of the laminated film. The leading edge portion of the laminated film 1B held on the plate 6 at the leading end portion 6D thereof by suction is supplied to the thin film adhering position by moving the plate in the direction A. Although the leading end portion 6D corresponds to the thin film temporary adhering member of the conventional thin film adhering apparatus, a heater for temporarily adhering is not provided because temporary adhering is not performed in the thin film adhering apparatus which is the embodiment of the present invention. Therefore, the construction of the main vacuum suction plate 6 is simplified. Although the plate 6 and the leading end portion 6D are integral with each other, they may be separately manufactured and then conjoined to each other if it is easier to manufacture them separately.

Figure 2:
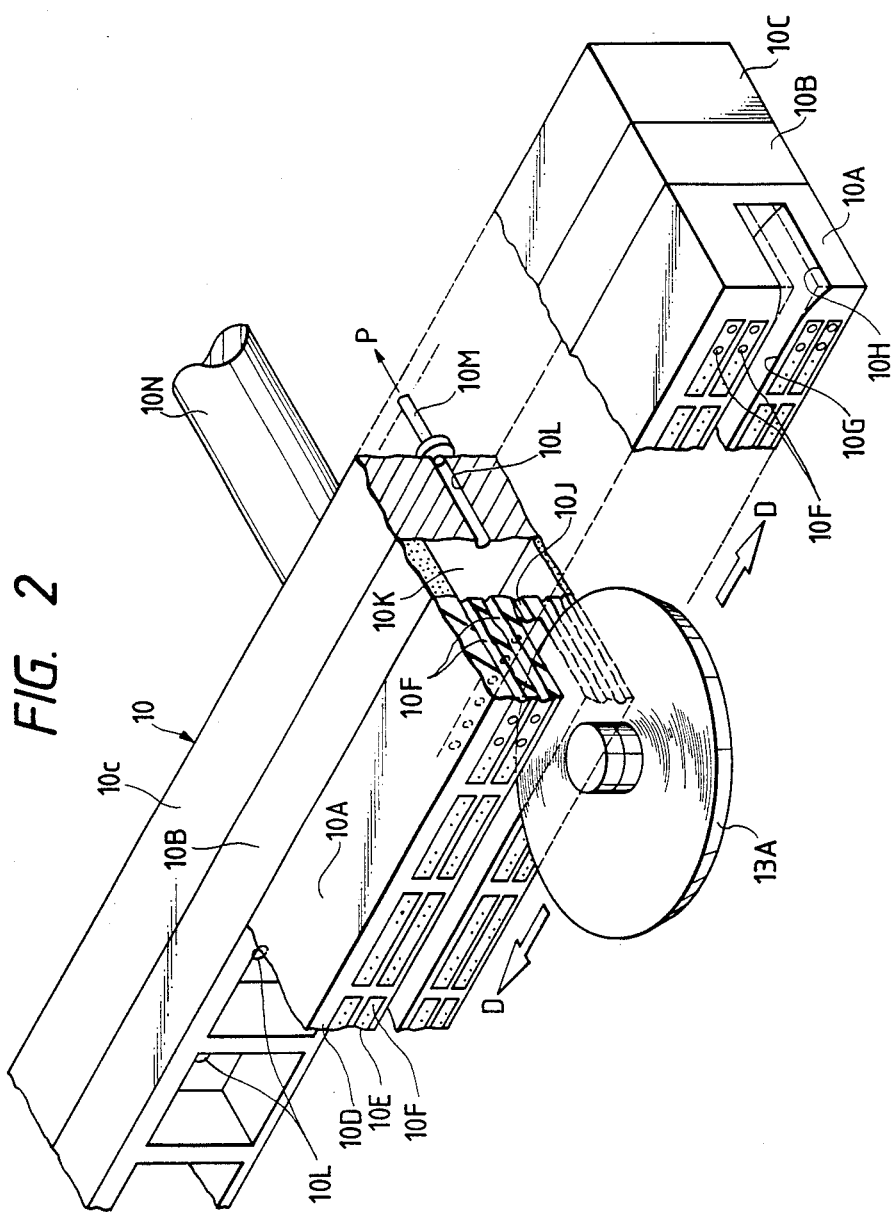
FIG. 2 shows a partial perspective sectional view of the auxiliary vacuum suction plate of the thin film adhering apparatus.
Figure 3:
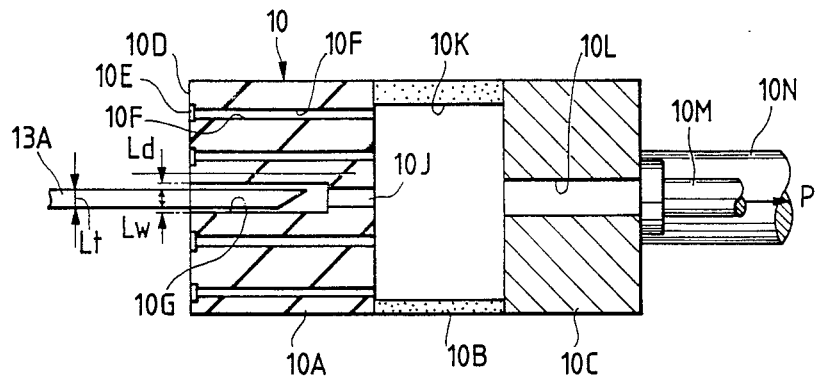
FIG. 3 shows a sectional view of the auxiliary vacuum suction plate.

An auxiliary vacuum suction plate 10, which is a holding member for cutting off the laminated film 1B, is provided between the main vacuum suction plate 6 and the thin film adhering position near the feed passage for the laminated film, as shown in FIG. 1. A pair of auxiliary vacuum suction plates 10 are provided above and below the base plate conveyance passage I—I. The auxiliary vacuum suction plate 10 includes a thin film suction element 10A, a vacuum suction chamber defining element 10B and a base element 10C. as shown in FIGS. 2 and 3. The thin film suction element 10A has a thin film suction side 10D facing the feed passage for the laminated film 1B and a guide groove 10G for cutting the laminated film 1B. The thin film suction side 10B is provided with thin film suction grooves 10E and thin film suction holes 10F on opposing sides of the guide groove 10G. Each of the suction holes 10F communicates at one end thereof with the bottom of the suction groove 10E. and at the other end thereof with a vacuum suction chamber 10K defined by the vacuum suction chamber defining element 10B. A plurality of suction grooves 10E are provided at intervals along the width of the laminated film 1B so that the number of the suction grooves corresponds to the width of the laminated film. The suction grooves 10E are located in such positions that the side edges of the laminated film 1B are not disposed on the suction grooves even if the width of the laminated film changes. Rather the side edges of the film 1B are disposed on the solid portion of the thin film suction side 10D. In other words, the suction grooves 10E are located so as to avoid disposing the side edges of the laminated film 1B on the grooves so as to permit air to enter into the grooves. The suctioning force on the laminated film IB is thus increased.

The guide groove 10G is disposed in the central portion of the thin film suction side 10D and extends along the width of the laminated film 1B. The depth of the guide groove 10G is relatively large, but the width thereof is relatively small. When the thickness Lt of the cutting member 13A of a cutter 13 shown in FIG. 3 is about 1.5 mm, for example the depth Ld of the guide groove 10G is about 2.0 to 4.5 mm and the width Lw thereof is about 2.0 mm. In other words the width of the guide groove 10G is close to the thickness of the cutting member 13A of the cutter 13. The guide groove 10G of relatively small width acts to guide the cutting member 13A in the longitudinal direction of the groove to accurately cut the laminated film 1B at the trailing edge portion. The guide groove 10G is provided with an inlet opening 10H at the end of the groove by gradually increasing the width of the groove, as shown in FIG. 2, so as to allow for smooth conveyance of the cutting member 13A into the groove. The guide groove 10G acts to suction the laminated film 1B at the trailing edge portion thereof against the suction side 10D so that the film is not loose but appropriately tight. As a result, the laminated film 1B is cut cleanly at the trailing edge portion thereof.

Additionally, the guide groove 10G, having relatively small width and relatively large depth, is designed so that a chip generated in cutting the laminated film 1B is not discharged outwardly from the groove but efficiently suctioned inward by a chip suction means described hereinafter. Chip suction holes 10J, which constitute a portion of the chip suction means, are provided on the inside wall of the guide groove 10G of the thin film suction element 10A. Each of the chip suction holes 10J communicates at one end thereof with the vacuum suction chamber 10K. The thin film suction element 10A having the suction side 10D. the suction grooves, 10E, the suction holes 10F, the guide groove 10G and the chip suction holes 10J is made of a material which is easy to form and process and has an appropriate hardness such as that of an aluminum alloy.

The vacuum chamber defining element 10B is provided between the thin film suction element 10A and the base element 10C and defines the vacuum suction chambers 10K provided in common for the thin film suction holes 10F and the chip suction holes 10J. Partition walls are provided for every prescribed number of the suction grooves 10E and divide the mutually adjacent vacuum suction chambers 10K from each other so that the chambers are independent of each other in vacuum suction. The vacuum suction chambers 10K are connected to the vacuum suction system P through the common suction hole 10L of the base member 10C and a suction pipe 10M. The plural vacuum suction chambers 10K are provided in such a manner that some vacuum suction chambers performing the vacuum suction because the thin film suction holes 10F corresponding to the chambers are covered by the laminated film 1B and the other vacuum suction chambers not performing the vacuum suction because the thin film suction holes 10F corresponding to the chambers are not covered by the laminated film are independent of each other as to the vacuum suction even if the width of the film changes. In other words, the force suctioning the laminated film 1B onto the thin film suction side 10D of the auxiliary vacuum suction plate 10 is not substantially reduced even if the width of the film changes. The chip suction holes 10J. the vacuum suction chambers 10K, the common suction holes 10L. the suction pipe 10M and the vacuum suction system P constitute the chip suction means by which the chips generated in cutting off the laminated film 1B is removed by suction.

The vacuum suction chamber defining element 10B is made of a hard rubber so that the element is kept airtight to the thin film suction element 10A and the base element 10C. The base element 10C is made of a material which is easy to form and process and has an appropriate hardness such as that of an aluminum alloy. The thin film suction element 10A, the vacuum suction chamber defining element 10B and the base element 10C are assembled with screws (not shown).

The auxiliary vacuum suction plate 10 acts so that the laminated film 1B is held at the portion which is to be cut by suction, and the leading edge portion of the following laminated film 1B being conveyed to the plate after the preceding laminated film 1B has been cut is held on the leading end portion 6D of the main vacuum suction plat 6 by suction For that purpose, the auxiliary vacuum suction plate 10 is moved toward and away from the feed passage for the laminated film IB in directions C, as shown in FIG. 1. The plate 10 is coupled to the support member 7 by a driver 7F made of an air cylinder and supported by a shaft 10N. The plate 10 also acts so that the trailing edge portion of the laminated film 1B is held by suction when the laminated film is being cut, and the laminated film is slacken at the trailing edge portion thereof between the plate 10 and a vacuum suction plate 12 during the process of adhering the laminated film. In order to make the laminated film IB slackened at the trailing edge portion thereof, the speed at which the laminated film is conveyed by the main vacuum suction plate 10 is higher than the circumferential velocity of the heat and pressure adhering roller 11, which is equal to the speed at which the laminated film is adhered using heat and pressure. The slackened laminated film 1B is cut while the film is adhered under heat and pressure.

The cutter 13 is provided in such a position that it faces the thin film suction side 10D of the auxiliary vacuum suction plate 10 across the feed passage for the laminated film 1B. as shown in FIG. 1. The cutter 13 has a disk-shaped cutting member 13A as shown in FIGS. 2 and 3. Although the cutting member 13A is provided with a cutting edge by grinding only one side of the member, in this embodiment, the member may be provided with a cutting edge by grinding both the sides of the member. The cutting member 13A is moved in the longitudinal direction D of the guide groove 10G of the auxiliary vacuum suction plate 10 along the width of the laminated film 1B. as shown in FIG. 2. The movement of the cutting member 13A is performed by air pressure, for example. The cutter 13 acts so that the laminated film 1B continuously supplied by the main vacuum suction plate 6 is cut to a prescribed length corresponding to the length of a base plate extending in the direction of conveyance thereof. A pair of such cutters 13 are provided on opposite sides of the base plate conveyance passage I—I. A means for moving the cutting member 13A of the cutter 13 to cut the laminated film IB, is equivalent to those described in detail in the Japanese Patent Applications (OPI) Nos. 259834/87 and 117487/88 disclosed by the present Applicant.

The heat and pressure adhering roller 11 is moved between an off-set position shown by a solid line in FIG. 1, and the thin film adhering position shown by a dotted line in FIG. 1. The vacuum suction plate 12 holds the trailing edge portion of the laminated film 1B by suction so as to apply an appropriate tensile force to the film to prevent it from undergoing a wrinkle or the like as the film is adhered to the base plate by the heat and pressure adhering roller 11. The vacuum suction plate 12 is prevented from rotating. A pair of heat and pressure adhering rollers 11 and a pair of vacuum suction plates 12 are provided on opposite sides of the base plate conveyance passage I—I. The heat and pressure adhering rollers 11, the vacuum suction plates 12 and the location thereof are equivalent to those described in detail in the Japanese Patent Applications (OPI) Nos. 259834/87 and 117487/88.

The base plate 14 for a printed circuit is conveyed in the base plate conveyance passage I—I by a base plate conveyance mechanism built in or attached to the thin film adhering apparatus. After the base plate 14 is conveyed to the thin film adhering position, the laminated film 1B is adhered to the base plate, under heat and pressure, and the base plate is then conveyed from that position to an exposure apparatus installed next to the thin film adhering apparatus. The base plate conveyance mechanism includes driving rollers 15A and driven rollers 15B. The base plate 14 consists of an electrically insulating plate 14A and electroconductive layers 14B made of copper or the like on both the sides of the plate, as shown in FIG. 12.

Figure 4:
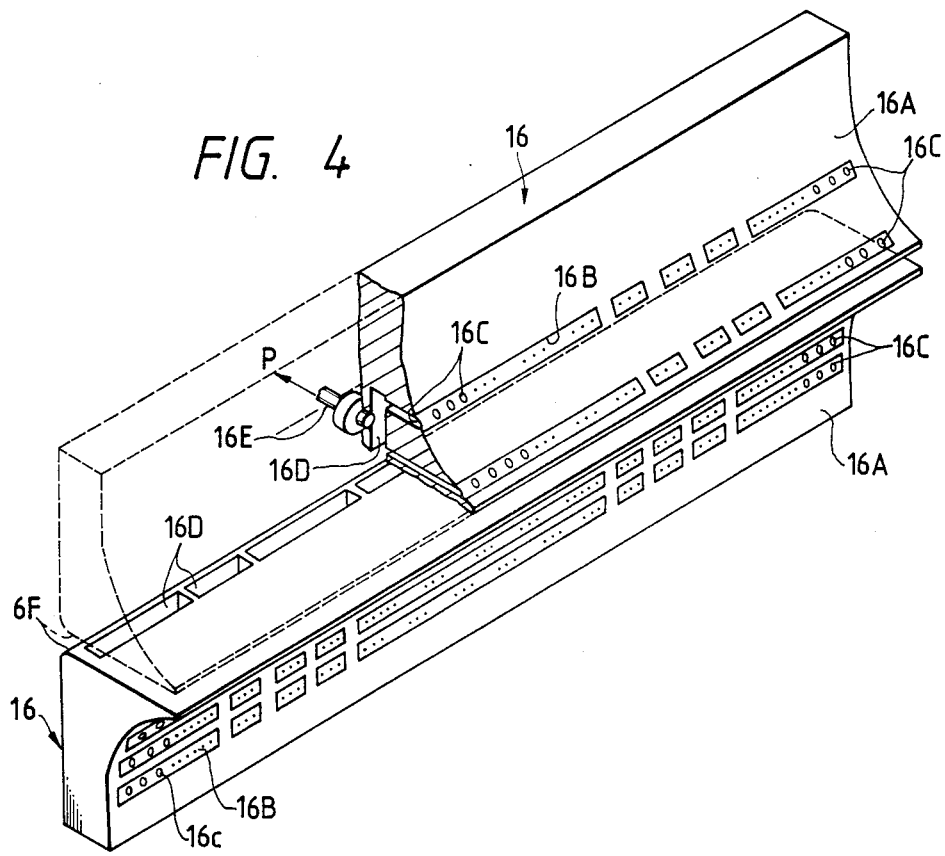
FIG. 4 shows a partial perspective sectional view of the thin film leading edge portion holding member of the thin film adhering apparatus.

The thin film trailing edge portion holding member 16 is provided in the thin film adhering position nearest the base plate conveyance passage I—I, as shown in FIG. 1. The member 16 is secured to the frame 9 of the thin film adhering apparatus directly or with an interposed fin adjustment mechanism or the like. The member 16 includes a holding side 16A. suction grooves 16B. suction holes 16C and vacuum suction chambers 16D, as shown in FIG. 4. The holding side 16A has an arcuate shape to correspond to the arcuate shape of the leading end portion 6D of the main vacuum suction plate 6 and the shape of the heat and pressure adhering roller 11. The holding side 16A is conveyed to the vicinity of the leading edge portion of the laminated film 1B supplied by the leading end portion 6D of the main vacuum suction plate 6 or is moved into contact with the leading edge portion of the laminated film, so that the leading edge portion of the supplied film is suctioned and held by a thin film suction means described hereinafter. The length of the arc-shaped curve of the holding side 16A is slightly smaller than that of the arc-shaped curve of the leading end portion 6D of the main vacuum suction plate 6 so that the holding side is located at a small distance from the thin film adhering position. For that reason, the heat and pressure adhering roller 11 does not come into contact with the thin film leading edge portion holding member 16 as the leading edge portion of the laminated film 1B is suctioned and held by the holding side 16A, as shown in FIG. 13. Therefore, the leading edge portion of the laminated film can be adhered to the electroconductive layer 14B of the base plate 14, under heat and pressure, by the roller.

The holding side 16A has a plurality of suction grooves 16B and a plurality of thin film suction holes 16C. Each of the suction holes 16C communicates at one end thereof with the bottom of the suction groove 16B, and at the other end thereof with a vacuum suction chamber 16D. Each suction groove 16B corresponds to one or more suction holes 16C disposed along the width of the laminated film 1B. The disposition of the suction grooves 16B corresponds to that of the vacuum suction chambers 16D which apply suction independently of each other. For that reason, the force of the holding member 16, which suctions the leading edge portion of the laminated film 1B onto the holding side 16A, is not substantially reduced even if the width of the laminated film changes, as is the case with the auxiliary vacuum suction plate 10. Suction pipes 16E connect the vacuum suction chambers 16D to a vacuum or reduced pressure system P made of a vacuum pump or the like (not shown). The corner 16F of the holding member 16, which is located at the base plate incoming side thereof near the base plate conveyance passage I—I opposite the thin film adhering position, is chamfered, as shown in FIGS. 4, 12 and 13, to smoothly guide the base plate 14. A thin film leading edge portion holding members 16 is provided above and below the base plate conveyance passage I—I. The number of the thin film suction holes 16C of the holding side 16A of the lower holding member 16 is larger than that of the thin film suction holes 16C of the holding side 16A of the upper holding member 16 because the lower holding member needs a stronger suction force than the upper holding member so as to cope with gravity. However, if the suction force of the lower holding member 16 is strong enough, the number of the suction holes 16C of the member may be equal to that of the suction holes of the upper holding member 16.

Sensors S1 and S2 are provided near the base plate conveyance passage I—I. as shown in FIG. 1. The sensor S1 detects the position of the leading edge of the base plate 14 to stop the leading edge in the thin film adhering position. The other sensor S2 detects the trailing edge of the base plate 14 to set the trailing edge portion of the laminated film 1B, which is to be cut, depending on the length of the base plate 14. The sensor S2 generates a detection signal to place the trailing edge portion of the laminated film 1B to be cut at the cutter 13. The sensors S1 and S2 are of the light transmission type, for example.

A fluid blower 17 is provided between the auxiliary vacuum suction plate 10 and the vacuum suction plate 12 near the feed passage for the laminated film 1B so as to make it easy to suction and hold the leading edge portion of the laminated film 1D on the leading end portion 6D of the main vacuum suction plate 6 and to slacken the laminated film at the leading edge of the film.

The other of the embodiments are directed to a method of adhering the laminated film 1B to the base plate 14, under heat and pressure, in the thin film adhering apparatus. The method is described with reference to FIGS. 5-13. The leading edge portion of the laminated film 1B. divided from the light-transmissible resin film 1A by the thin film separation roller 3, is first manually placed between the thin film suction side 10D of the auxiliary vacuum suction plate 10 and the cutter 13, as shown in FIG. 5. The leading edge portion of the film 1B is then suctioned and held by the suction side 10D of the plate 10. The plate 10 is thereafter moved in the direction C by the driver 7F shown in FIG. 1 so that the leading edge portion of the laminated film is conveyed to a position distant from the feed passage for the film and suctioned and held on the leading end portion 6D of the main vacuum suction plate 6. If the thin film adhering apparatus is already in continuous operation, the leading edge portion of the laminated film 1B cut by the cutter 13 is suctioned and held on the leading end portion 6D of the main vacuum suction plate 6.

The leading edge of the base plate 14, conveyed in the base plate conveyance passage I—I by the driving and driven rollers 15A and 15B of the base plate conveyance mechanism, is stopped in the thin film adhering position after the leading edge of the base plate is detected by the sensor S1 to stop the driving rollers in accordance with the detection signal generated by the sensor. When the base plate 14 is conveyed by the base plate conveyance mechanism, the base plate passes between the upper and the lower thin film leading edge portion holding members 16 located above and below the base plate conveyance passage I—I. At that time, the chamfered corners 16 guide the base plate 14, as shown in FIGS. 4, 12 and 13, to prevent the base plate from undergoing an improper conveyance such as catching on the holding members.

The leading end portion 6D of the main vacuum suction plate 6 is then moved toward the leading edge portion of the base plate 14 stationarily disposed in the thin film adhering position, so that the leading edge portion of the laminated film 1B is supplied to the adhering position, as shown in FIG. 7. The leading end portion 6D of the main vacuum suction plate is then conveyed to the thin film adhering position so that the leading end portion is located near the thin film adhering side of the base plate 14 at the leading edge thereof, as shown in FIGS. 8 and 12. Although the leading end portion 6D may be brought into slight contact with the thin film adhering side of the base plate 14 at the leading edge thereof, it is preferable that the leading end portion not be brought into contact with the base plate. The suction of the main vacuum suction plate 6 and the leading end portion 6D are then terminated. At that time, the holding side 16A of the thin film leading edge holding member 16 is in such a position as to face the leading end portion 6D, and the leading edge portion of the laminated film 1B. supplied to the thin film adhering position, is suctioned and held on the holding side 16A of the holding member by the suctioning action of the vacuum suction system P through the thin film suction holes 16C of the holding member. The suctioned and held leading edge portion of the laminated film 1B is shown by a dotted line in FIG. 12. The distance between the leading end portion 6D of the main vacuum suction plate 6 and the holding side 16A of the holding member 16, on which the leading edge portion of the laminated film IB is suctioned and held, is set to be as small as about 1 mm. Since the laminated film 1B has an elasticity, the restoring force of the film acts after suction of the main vacuum suction plate 6 and the leading end portion 6D is stopped, so that the leading end portion of the film is instantaneously suctioned and held on the holding side 16A of the holding member 16. The most leading edge portion of the laminated film 1B. suctioned and held on the holding side 16A of the holding member 16, projects slightly from the holding side toward the thin film adhering position so that the heat and pressure adhering roller 11 can be moved from the off-set position to the thin film adhering position without coming into contact with the thin film leading edge holding member 16. A fluid such as pressurized air may be blown onto the holding side 16A of the holding member 16 immediately after the main vacuum suction plate 6 and the leading end portion 6D are out of the suctioning action, in order to more instantaneously suction and hold the leading edge portion of the laminated film IB on the holding side of the holding member. To blow the fluid onto the holding side 16A, the thin film suction holes 6C of the leading end portion 6D are used as fluid blowoff holes and a blower such as a compressor and a changeover valve for switching the vacuum suction system P for the blower is provided.

As shown in FIG. 9, the main vacuum suction plate 6 and the leading end portion 6D are moved away from the thin film adhering position as the leading edge portion of the laminated film 1B remains held on the holding side 16A of the holding member 16 by suction so that the main vacuum suction plate and the leading end portion are located closer to the feed roller 2 than in the case that the plate and the leading end portion are located as shown in FIG. 5. The movement of the heat and pressure adhering roller 11 from the off-set position to the thin film adhering position is started in response to the movement of the plate 6 and the portion 6D from the thin film adhering position, When the roller is moved to the thin film adhering position, the roller comes into contact with the most leading edge portion of the laminated film IB held on the holding side 16A of the holding member 16 by suction, so that appropriate pressure acts on the most leading edge portion of the film. Subsequently, the roller 11 is rotated and the base plate 14 is conveyed in a direction E by the base plate conveyance mechanism, so that the laminated film 1B begins to be adhered to the base plate, under heat and pressure, gradually from the leading edge of the base plate toward the trailing edge thereof, by the rotation of the roller 11 and the conveyance of the base plate. Since the main vacuum suction plate 6 is no longer applying suction at that time, the laminated film 1B is automatically and gradually supplied to the thin film adhering position by the rotation of the roller 11 and the conveyance of the base plate 14. However, the auxiliary vacuum suction plate 10 or the vacuum suction plate 12 is applying suction at that time so as to apply the appropriate tensile force to the still-unstuck laminated film 1B to prevent it from experiencing a wrinkle or the like.

Since the laminated film 1B is supplied to the thin film adhering position along the heat and pressure adhering roller 11 by the rotation of the roller and the conveyance of the base plate 14 as shown by a full line in FIG. 13, the thin film leading edge portion holding member 16 may or may not apply suction after the laminated film has initially become adhered to the base plate, under heat and pressure. However, if the photosensitive resin layer 1BR of the laminated film 1B and the holding side 16A of the holding member 16 are likely to rub each other after the start of the heat and pressure adhering of the film so as to damage the layer, it is preferable that the holding member does not apply suction after the laminated film has begun to be adhered to the base plate.

When the trailing edge of the base plate 14 is detected by the sensor S2 during the heat and pressure adhering of the laminated film 1B, the main vacuum suction plate 6, retained in the position most distant from the thin film adhering position and the auxiliary vacuum suction plate 10 secure the laminated film by suction. The portion of the laminated film 1B. which is held by the auxiliary vacuum suction plate 10, is to be cut in the face of the cutoff guide groove 10G of the plate. The support member 7 shown in FIG. 1 is moved in the direction B at a speed higher than that of the heat and pressure adhering of the laminated film 1B, so that the support member is stopped in such a position that the cutoff guide groove 10G faces the cutting member 13A of the cutter 13. As a result, the laminated film 1B is formed with the slackened portion of the trailing edge thereof between the auxiliary vacuum suction plate 10 and the vacuum suction plate 12. Thereafter, the cutting member 13A is moved along the width of the laminated film IB so that the film is cut at the trailing edge portion thereof as shown is FIG. 11. The cut length of the laminated film 1B corresponds to the length of the base plate 14. Since the laminated film IB has the slackened portion, the film can be cut while the film continues to be adhered to the base plate 14, under heat and pressure. The cut trailing edge portion of the laminated film 1B is adhered to the thin film adhering side of the base plate 14 at the trailing edge portion thereof, under heat and pressure, so that the heat and pressure adhering of the whole laminated film 1B is completed. Thereafter, the vacuum suction plate 12 is rotated and the holding member 16 is set aside. In the alternative, it may be performed in such a manner that the vacuum suction plate 12 is rotated and the heat and pressure adhering roller 11 is slightly moved to such an extent that it is not obstructive. Until the point in time immediately before the completion of the heat and pressure adhering, the suctioning action is performed on the laminated film 1B to apply an appropriate tensile force thereto to prevent the film from experiencing a wrinkle or the like. The base plate 14, with the laminated film 1B adhered thereto under heat and pressure, is conveyed by the base plate conveyance mechanism to the exposure apparatus installed next to the thin film adhering apparatus.

The method, in which the laminated film 1B, whose length corresponds to that of the base plate 14, is adhered to the thin film adhering side of the base plate by the heat and pressure adhering roller 11 as described above, comprises the following steps: suctioning the leading edge portion of the continuous laminated film onto the main vacuum suction plate 6 and the leading end portion 6D; moving the main vacuum suction plate and the leading end portion toward the thin film adhering side of the leading edge portion of the base plate conveyed to the thin film adhering position, so that the leading edge portion of the continuous laminated film is supplied to the thin film adhering position; holding the leading edge portion of the laminated film in the adhering position; moving the main vacuum suction plate 6 and the leading end portion 6D away from the thin film adhering side of the base plate: moving the heat and pressure adhering roller 11 to the leading edge portion of the laminated film, held in the thin film adhering position and then rotating the roller so that the laminated film is adhered to the thin film adhering side of the base plate from the leading edge thereof toward the trailing edge thereof while the laminated film is automatically supplied to the thin film adhering position: cutting the continuous laminated film IB at the trailing edge portion thereof to the length corresponding to that of the base plate, and thereafter adhering the trailing edge portion to the thin film adhering side of the base plate at the trailing edge portion thereof by the heat and pressure adhering roller. Since the leading edge of the laminated film is supplied to the thin film adhering position and thereafter held in the position at the time of the movement of the heat and pressure adhering roller 11 to the position, the leading edge portion of the laminated film does not need to be temporarily adhered to the thin film adhering side of the leading edge portion of the base plate 14. For that reason,complicated conditions such as temporary adhering temperature, temporary adhering period and temporary adhering pressure do not need to be set. Therefore, improper temporary adhering such as nonuniform temporary adhering and void-generation temporary adhering which would result from failing to properly set the complicated conditions, is avoided. As a result, the yield in the adhering of the laminated film IB is improved. Since the laminated film IB does not need to be temporarily adhered to the base plate 14, the main vacuum suction plate 6 and the leading end portion 6D can be moved away from the thin film adhering position immediately after the supply of the leading edge portion of the laminated film 1B to the adhering position so as to place the heat and pressure adhering roller 11 in the adhering position. For that reason, the period of the adhering of the whole laminated film IB to the base plate 14 can be shortened.

Since the thin film leading edge portion holding member 16, which includes the holding side 16A and the thin film suction holes 16C provided in the holding side, is provided in the thin film adhering apparatus instead of a temporary adhering member which includes a heater built therein and which is complicated in construction, the overall construction of the apparatus is simplified.

Since the thin film adhering apparatus includes the chip suction means by which the chips made from cutting the continuous laminated film IB are removed by suction, the chips are prevented from being left on the base plate 14, between the base plate and the laminated film, on the laminated film or in the film of the apparatus and from causing the laminated film to be improperly adhered to the base plate. Therefore, the yield in the adhering is improved. Since the width of the cutoff guide groove 10G of the auxiliary vacuum suction plate 10 is made relatively small, approximate to the thickness of the cutting member 13A, and the chip suction holes 10J are opened into the guide groove and connected to the vacuum suction system P constituting a portion of the chip suction means, a tensile force is applied to the portion of the laminated film 1B to be cut by the guide groove to cut the film cleanly and the interior of the guide groove experiences suction to suction the chips effectively.

The present invention is not confined to the above-described embodiments but may be embodied or practiced in other various ways without departing from the spirit or essential character thereof. For example the cutter 13 of the thin film adhering apparatus may be attached to the support member 7 which supports the main vacuum suction plate 6 and the auxiliary vacuum suction plate 10. In that case, the laminated film 1B can be cut while it is being supplied and adhered to the base plate 14, under heat and pressure. For that reason, the laminated film 1B does not need to be formed with the loose portion. Besides, the auxiliary vacuum suction plate 10 may be attached to the film of the thin film adhering apparatus. Although the laminated bodies IB are adhered to both the film adhering sides of the base plate 14, under heat and pressure, in the thin film adhering apparatus the present invention may be embodied as a thin film adhering apparatus in which a laminated film is adhered to only one thin film adhering side of a base plate under heat and pressure. The, heat and pressure adhering roller 11 may be replaced by a non-heat pressure adhering roller, depending on the materials of the laminated film 1B. The present invention may also be embodied as a thin film adhering art in which a protective film is adhered to the surface of an ornamental panel as a building material.

What is claimed is:

1. A thin film adhering apparatus in which a thin film whose length corresponds to that of a substrate is adhered to the thin film adhering side of said substrate by a pressure adhering roller, comprising:
   a substrate conveyance mechanism for conveying said substrate to a thin film adhering position and for moving said substrate from said position;
   a thin film feed member for adhering the leading edge portion of the continuous thin film and supplying said leading edge portion to said adhering position;
   a thin film leading edge portion holding member disposed proximate said adhering position, said holding member having a holding side which comes into surface contact with the leading edge portion of said film supplied to said position said holding side having thin film suction holes communicating with a vacuum suction system for suctioning the leading edge portion of said film onto said holding side, said continuous film held in said position by said holding member being adhered to the thin film adhering side of said substrate from the leading edge portions of said film and said substrate to the trailing edge portions thereof by said roller; and
   a cutter for cutting said continuous film at the trailing edge portion thereof to said length corresponding to that of said substrate.

2. A thin film adhering apparatus according to claim 1, wherein the thin film leading edge portion holding member is provided near an upper thin film adhering position in which the thin film is adhered to the upper thin film adhering side of the substrate; and another thin film leading edge portion holding member is provided near a lower thin film adhering position in which another thin film is adhered to the lower thin film adhering side of said substrate.

3. A thin film adhering apparatus according to claim 2, wherein the number of the thin film suction holes of the thin film leading edge portion holding member provided near the lower thin film adhering position is greater than that of the thin film suction holes of the thin film leading edge portion holding member provided near the upper thin film adhering position.

4. A thin film adhering apparatus according to claim 1, wherein a predetermined number of thin film suction holes of the thin film leading edge portion holding member communicate with the vacuum suction system through independent vacuum suction chambers such that suction is independently applied to said predetermined number of holes.

5. A thin film adhering apparatus according to claim 1, wherein the shape of the holding side of the thin film leading edge portion holding member is substantially the same as the shape of the portion of the thin film feed member which holds the leading edge portion of the thin film.

6. A method in which a thin film, whose length corresponds to that of a substrate, is adhered to the thin film adhering side of said substrate by a pressure adhering roller, comprising the steps of:
   adhering the leading edge portion of the continuous thin film onto a thin film feed member;
   conveying said film feed member to the vicinity of the thin film adhering side of the leading edge portion of said substrate conveyed to a thin film adhering position, so that the leading edge portion of said continuous film is supplied to said position;
   conveying said film feed member away from the thin film adhering side of said substrate;
   moving said pressure adhering roller to the vicinity of the leading edge portion of said film held in said position;
   rotating said roller so that said film is adhered to the thin film adhering side of said substrate from the leading edge portion thereof to the trailing edge portion thereof while said film is being automatically supplied to said position;
   cutting said continuous film at the trailing edge portion thereof to said length corresponding to that of said substrate; and
   adhering said trailing edge portion to the thin film adhering side of the trailing edge portion of said substrate by rotating said roller.

7. A method according to claim 6, wherein the thin film is a laminated film consisting of a photosensitive resin layer and a light-transmissible resin film; and the substrate is made of an electrically insulating substrate provided with an electroconductive layer on the thin film adhering side of said substrate.

8. A method according to claim 6, wherein thin films are substantially simultaneously adhered to both the mutally-opposite thin film adhering sides of the substrate.

9. A method of according to claim 6, wherein the trailing edge portion of the thin film cut at said trailing edge portion is held by suction until the point in time immediately before said trailing edge portion is adhered to the thin film adhering side of the trailing edge portion of the substrate by the pressure adhering roller.

* * * * *